(12) United States Patent
Karri et al.

(10) Patent No.: US 12,003,090 B2
(45) Date of Patent: Jun. 4, 2024

(54) CURRENT CONTROLLED ARCHITECTURE FOR A Vconn SWITCH

(71) Applicant: Cypress Semiconductor Corporation, San Jose, CA (US)

(72) Inventors: Rajesh Karri, Visakhapaptnam (IN); Arun Khamesra, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 262 days.

(21) Appl. No.: 17/325,349

(22) Filed: May 20, 2021

(65) Prior Publication Data

US 2022/0069562 A1    Mar. 3, 2022

Related U.S. Application Data

(60) Provisional application No. 63/074,007, filed on Sep. 3, 2020.

(51) Int. Cl.
| | |
|---|---|
| *H02H 3/087* | (2006.01) |
| *G06F 1/26* | (2006.01) |
| *G06F 13/38* | (2006.01) |
| *G06F 13/40* | (2006.01) |
| *G06F 13/42* | (2006.01) |
| *H02H 1/00* | (2006.01) |
| *H03K 17/082* | (2006.01) |

(52) U.S. Cl.
CPC ............. *H02H 3/087* (2013.01); *G06F 1/266* (2013.01); *G06F 13/385* (2013.01); *G06F 13/4068* (2013.01); *G06F 13/4282* (2013.01); *H02H 1/0007* (2013.01); *H03K 17/0822* (2013.01); *G06F 2213/0042* (2013.01)

(58) Field of Classification Search
CPC ...... H02H 3/087; H02H 1/0007; G06F 1/266; G06F 1/26; G06F 1/263; G06F 13/385; G06F 13/4068; G06F 13/4282; G06F 13/4295; G06F 2213/0042; H03K 17/0822
USPC ........................................ 361/93.1
See application file for complete search history.

(56) References Cited

U.S. PATENT DOCUMENTS

| | | | | |
|---|---|---|---|---|
| 5,654,859 | A | * | 8/1997 | Shi ............................. H02J 9/00 361/100 |
| 5,892,647 | A | * | 4/1999 | Mizoe ...................... G05F 1/573 361/57 |
| 2017/0317583 | A1 | * | 11/2017 | Forghani-Zadeh ......................... H03K 17/04206 |

(Continued)

*Primary Examiner* — Thienvu V Tran
*Assistant Examiner* — Sreeya Sreevatsa

(57) ABSTRACT

A Universal Serial Bus controller including a Vconn switch having a current controlled architecture, and method for operating the same are provided. Generally, the Vconn switch includes first and second transistors coupled in series between a Vconn terminal and a communication channel (CC) terminal, a replica switch including a source coupled to the Vconn terminal, a replica current generator including a first input coupled to a drain of the replica switch and a second input coupled to a drain of the first transistor, and a resistance control module coupled to an output of the replica current generator and including an output coupled to a gate of the second transistor. The replica current generator is operable to match a current through the replica switch to that supplied through the first and second transistors to the CC terminal, and the resistance control module is operable to control resistance of the Vconn switch.

19 Claims, 9 Drawing Sheets

(56) References Cited

U.S. PATENT DOCUMENTS

2019/0319446 A1* 10/2019 Mondal .................. H02H 3/087
2019/0393694 A1* 12/2019 Venigalla ................ G06F 1/266

* cited by examiner

CURRENT CONTROLLED ARCHITECTURE FOR A Vconn SWITCH

CROSS-REFERENCE TO RELATED APPLICATIONS

This application is claims the benefit of priority under 35 U.S.C. 119(e) to U.S. Provisional Patent Application Ser. No. 63/074,007, filed Sep. 3, 2020, which is incorporated by reference herein in its entirety.

TECHNICAL FIELD

This disclosure relates generally to an integrated circuits (IC) Universal Serial Bus (USB) controller that control power delivery to electronic devices, and more particularly to an IC USB type-C controller including a Vconn switch with architecture for providing over-current and short circuit protection, and methods for operating the same.

BACKGROUND

Various electronic devices (e.g., such as smartphones, tablets, notebook computers, laptop computers, chargers, adapters, power banks, etc.) are configured to transfer power through universal serial bus (USB) connectors according to USB power delivery protocols defined in various versions and revisions of the USB Power Delivery (USB-PD) specification. For example, the USB-PD specification defines a Vconn voltage supply for providing 3.0V-5.5V to a USB Type-C chip through a Vconn transistor switch (Vconn switch).

Prior implementations of an on-chip controller for controlling a resistance and operation of the Vconn switch typically relied on a scaled current through a scaled switch designed to produce a scaled current proportional to that passing through the Vconn switch in order to detect an over current event and control the Vconn switch to provide over-current-protection (OCP) to the USB Type-C. This approach has proved unsatisfactory for a number of reasons. One problem is inaccurate detection as drain nodes of the scaled switch and Vconn switch are uncorrelated, causing large variations in OCP detection threshold. Another problem is that an OCP circuit of the controller does not work at startup, but has a dead time equivalent to a turn on time of the scaled switch before the circuit performs reliably. Yet another related problem is that the OCP circuit cannot detect a short circuit event when the scaled switch is being turned on. Finally, a sinking current through the scaled switch is generally independent of load current supplied to a communication channel (CC) through the Vconn switch in order to manage connections across the USB Type-C cable. Thus, a very high ratio of load current to quiescent current through the USB Type-C can result in relatively large power losses for the OCP circuit of the controller.

Accordingly, there is a need for a controller with an OCP circuit for use in a USB Type-C cable and method for operating the same to protect against over current conditions and short-circuits. It is further desirable that the circuit and method provide reliable performance at all times including during start-up.

SUMMARY

A Universal Serial Bus (USB) controller including a Vconn switch having a current controlled architecture, and method for operating the same are provided. Generally, the Vconn switch includes first and second transistors coupled in series between a Vconn terminal (alternatively known as V5V terminal) and a communication channel (CC) terminal, a replica switch including a source coupled to the Vconn terminal, a replica current generator including a first input coupled to a drain of the replica switch and a second input coupled to a drain of the first transistor, and a resistance control module coupled to an output of the replica current generator and including an output coupled to a gate of the second transistor. The replica current generator is operable to match a replica current through the replica switch to that supplied through the first and second transistors to the CC terminal, and the resistance control module is operable to control resistance of the Vconn switch, thereby controlling an in-rush current to the CC terminal.

In another aspect a method for operating a Vconn switch having a current-controlled architecture, such as described above is disclosed. Generally, the method begins with receiving an input voltage on a Vconn terminal coupled to a CC terminal through a first transistor connected in series with a second transistor. The input voltage is then coupled to a source of a replica switch connected to the Vconn terminal, and to a source of the first transistor. Next, a current supplied through the first and second transistors to the CC terminal is matched to a replica current through the replica switch generated by a replica current generator, where the replica current generator has a first input coupled to a drain of the replica switch, and a second input coupled to a drain of the first transistor as described above. Finally, a gate of the second transistor is controlled using a resistance control module coupled to an output of the replica current generator to control resistance of the Vconn switch, thereby controlling an in-rush current to the CC terminal. Controlling the in-rush current is particularly desirable on start-up of a USB controller including the Vconn switch and/or when a short-circuit in a cable coupled to the CC terminal results in a short-circuit or over-current event. Optionally, the Vconn switch further includes a programmable trigger module coupled to the output of the replica current generator, and the method further includes comparing the replica current with one or more current set-points using the programmable trigger module and turning off the Vconn switch on detection of an over current event.

The Vconn switch having a current controlled architecture, and method for operating the same are particularly useful in a Universal Serial Bus Type-C (USB-C) controller further including a central processing unit (CPU) subsystem, system resources, an input/output (I/O) subsystem and a USB power delivery (USB-PD) subsystem including the Vconn switch. In an exemplary embodiment, the first and second transistors are coupled to the CC terminal through a power-rail, and the power-rail is coupled to a VDDD supply to power the USB controller.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

DETAILED DESCRIPTION

An integrated circuit (IC) Universal Serial Bus (USB) including a Vconn switch with current-controlled architecture for providing over-current and short circuit protection, and methods for operating the same are disclosed.

In the following description, for purposes of explanation, numerous specific details are set forth in order to provide a thorough understanding of the present invention. It will be evident, however, to one skilled in the art that the present invention can be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein can include both to directly electrically connect two or more components or elements and to indirectly connect through one or more intervening components.

Figure 1:
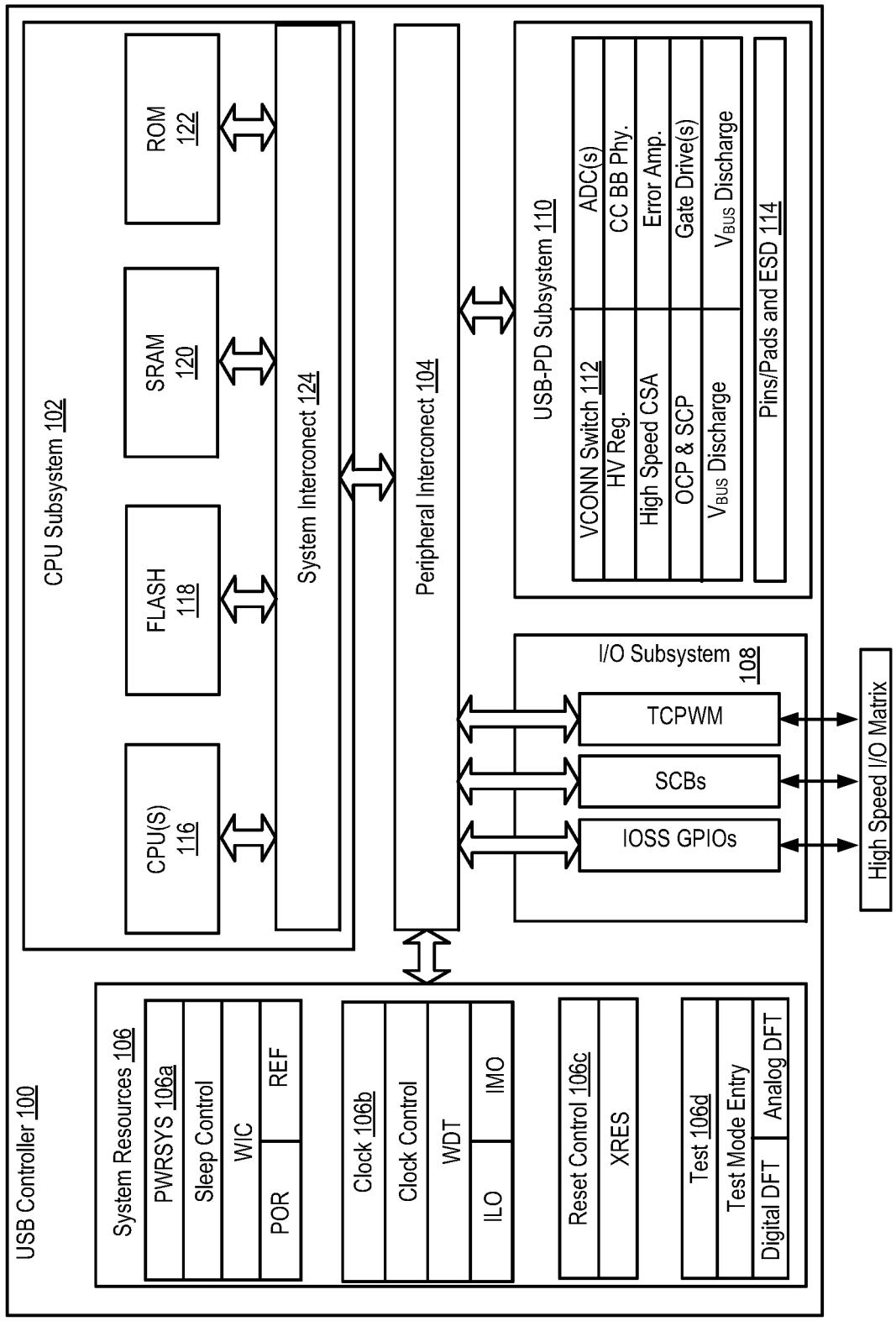
FIG. 1 is a block diagram illustrating a universal serial bus (USB) controller including a Vconn switch having a current controlled architecture in accordance with exemplary embodiments of the present disclosure.

FIG. 1 is a block diagram illustrating an on-chip, integrated (IC) USB controller including a Vconn switch having a current-controlled architecture configured or operable to provide over-current protection (OCP) and short-circuit protection (SCP) through the Vconn switch, inrush current control to prevent drooping of an internal regulated voltage supply when the controller is turned on, and SCP—including at startup, and a low quiescent current with the OCP and SCP being turned on for no load scenarios.

Referring to FIG. 1, the USB controller 100 generally includes a central processing units (CPU) subsystem 102, peripheral interconnect 104, system resources 106, input/output (I/O) subsystem 108, and a USB power delivery (USB-PD) subsystem 110 including the Vconn switch 112, and an electro-static discharge (ESD) protection block 114 with various pins or pads configured for receiving and sending signals through a USB connector.

The CPU subsystem 102 includes one or more CPUs 116, flash memory 118, Static Random Access Memory (SRAM 120), and Read Only Memory (ROM 122) all coupled through a system interconnect 124. The CPU(s) 102 can include any suitable processor capable of operating in an integrated circuit (IC) USB controller 100 or a system on a chip (SoC) device. The flash memory 118 is a fast, non-volatile memory (e.g., NAND flash, NOR flash, etc.) having shorter access or read times that is configured or operable to store data and programs. The SRAM 120 is another volatile memory that is configured for storing data and firmware instructions accessed by the CPU(s) 116. The ROM 122 can include an embedded non-volatile memory (eNVM) that is configured for storing boot-up routines, configuration parameters, and other firmware parameters and settings. The system interconnect 124 can include a single-level Advanced High-Performance Bus (AHB) or system bus that is configured as an interface that couples the various components of the CPU subsystem 102 to each other, as well as a data and control interface between the various components of the CPU subsystem and the peripheral interconnect 104.

Peripheral interconnect 104 can include another AHB or peripheral bus that provides the primary data and control interface between CPU subsystem 102 and other subsystems and resources, such as the system resources 106, the I/O subsystem 108, and the USB-PD subsystem 110.

The system resources 106 can include various electronic circuits and subsystems to support various states and modes of operation of the USB controller 100. For example, the system resources 106 can include a power subsystem (PWR-SYS 106*a*) including analog and/or digital circuits such as sleep control circuits, a wake-up interrupt controller (WIC), a power-on-reset (POR), voltage and/or current reference generators or circuits (REF). The system resources 106 can also include a clock subsystem 106*b* having analog and/or digital circuits such as, for example, clock control circuits, watchdog timer (WDT) circuit(s), internal low-speed oscillator (ILO) circuit(s), and internal main oscillator (IMO) circuit(s). The system resources 106 can also include analog and/or digital circuit reset circuits 106*c* that provide reset control and support external reset (XRES). In some embodiments, such as that shown, the system resources 106 can further include a test subsystem 106*d*, including various test circuits or blocks for test mode entry and analog and/or digital design-for-testability (DFT) operations.

The I/O subsystem 108 can include various different types of I/O blocks and subsystems including, for example, general purpose input output blocks subsystems (IOSS GIPOs), timer/counter/pulse-width-modulation (TCPWM) blocks, and serial communication blocks (SCBs).

The USB-PD subsystem 110 provides an interface to a USB connector or port, and is configured to support USB communications as well other USB functionality, such as power delivery and battery charging. Generally, the USB-PD subsystem 110 includes other circuitry, in addition to the Vconn switch 112 and the ESD protection block 114. Among other circuitry, USB-PD subsystem 110 may further include: one or more analog-to-digital convertors (ADCs) for converting various analog signals to digital signals; an error amplifier (ERROR AMP) for controlling the power source voltage applied to a VBUS line per a USB-PD specification; a high voltage regulator (HV REG) for converting the power supply voltage to a precise voltage (e.g., 3-5V) needed to power the USB controller 100; a high-speed current sense amplifier (HSCSA) and an over-current protection (OCP) and short circuit protection (SCP) circuit for providing over-current and short circuit protection with configurable thresholds and response times to circuits in the controller; one or more gate drivers (GATE DRV) for controlling the power switches that turn on and off the provision of power over the VBUS line; a communication channel (CC) physical layer or logic (CC BB PHY) for supporting communications on a CC line; and at least one discharge circuit (VBUS DISCH) that can discharge a VBUS line voltage to any one of a range of programmable voltage levels.

Figure 2:
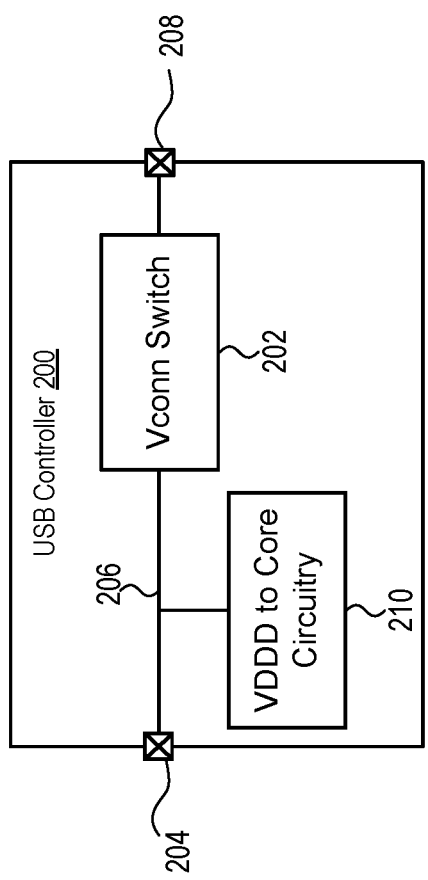
FIG. 2 is a block diagram illustrating a power supply architecture for a USB controller including a Vconn switch.

FIG. 2 is a block diagram illustrating a power supply architecture for a USB controller 200 including a Vconn switch circuit 202 (also referred to herein as just "Vconn switch") with a current controlled architecture. Referring to FIG. 2 the power supply architecture for the USB controller 200 includes a Vconn terminal 204 to which a Vconn or V5V voltage is applied from a regulated internal voltage supply or external power supply, and a power rail 206 through which the voltage is coupled to the Vconn switch 202, and through the Vconn switch to a CC terminal 208. Generally, as in the embodiment shown the power rail 206 is further coupled to provide an internal voltage (VDDD) to power core circuitry 210. The core circuitry 210 can include some or all of the circuits of the system resources and subsystems of the USB controller 100 shown in FIG. 1. For example, core circuitry 210 may include various low-voltage analog circuits that require input voltage in the range of 2.0V-5.5V.

The Vconn switch 202 is controlled by internal digital blocks and logic (shown and described with reference to FIGS. 3 and 4 below) to convert and couple an input voltage (e.g., in the range 3.0V-5.5V) on Vconn terminal 204 to a voltage on the CC terminal 208 in a voltage range of about 3.0V to about 5.5V.

Embodiments of a Vconn switch including a current controlled architecture suitable for use in a USB controller will now be described with reference to FIGS. 3 and 4. Generally, the Vconn switch has an architecture including a replica switch, a load based replica current generator, and a replica current based dynamic resistance control module, which accurately replicates in the replica switch current through a main switch or transistor and controls a gate of the main switch or transistor to control inrush current, and to detect over current and short circuit events and turns off or open the Vconn switch when such events are detected.

Figure 3:
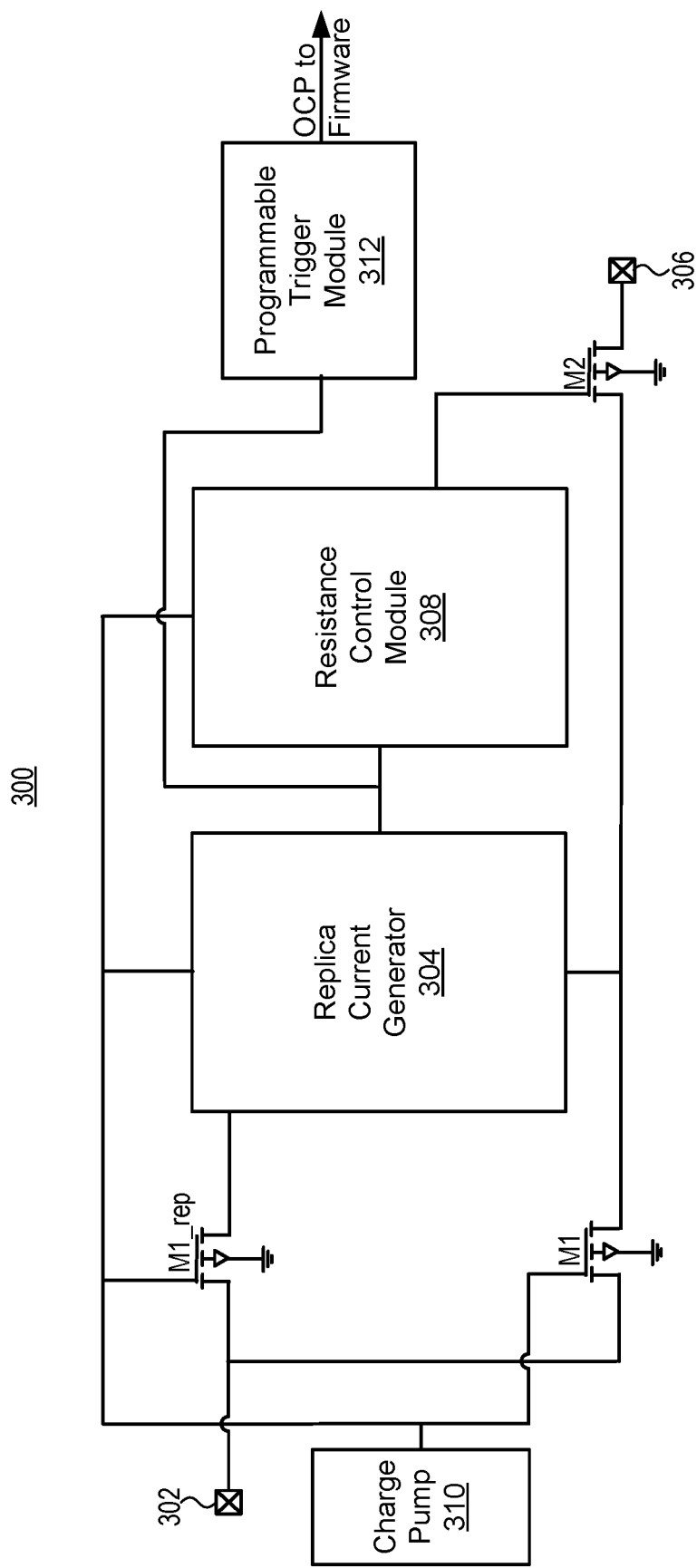
FIG. 3 is a block diagram illustrating an embodiment of a Vconn switch architecture suitable for use in a USB controller.

FIG. 3 is a block diagram illustrating an embodiment of a Vconn switch architecture suitable for use in a USB controller. Referring to FIG. 3 the Vconn switch 300 generally includes a main switch or first transistor M1 having a source coupled to a Vconn terminal 302, and a drain coupled to a first input of a replica current generator 304, and, through a second transistor M2 to a communication channel terminal (CC terminal 306). A replica transistor or switch (M1_rep) is coupled in parallel with the first transistor M1, having a source coupled to the Vconn terminal 302 and a drain coupled to a second input of the replica current generator 304. The Vconn switch 300 further includes a resistance control module 308 having an input coupled to an output of the replica current generator 304, and a charge pump 310 having an output coupled in parallel to gates of the first transistor M1 and the replica switch M1_rep, and to the replica current generator and the resistance control module.

The first transistor M1 and replica switch M1_rep are matched four terminal field effect transistors or FETs having a gate, drain, source and a body or substrate terminal coupled to ground. By matched it is meant the first transistor M1 and replica switch M1_rep are sized and integrally fabricated on a single substrate or chip to exhibit substantially identical electrical characteristics. Generally, the first transistor M1 and replica switch M1_rep are sized and fabricated to operate with gate to source and drain to gate voltages of about 5V. The second transistor M2 can include a high voltage drain extended FET that is capable of withstanding a voltage of at least 20V between its drain and its gate.

Optionally, as in the embodiment shown, the Vconn switch 300 further includes a programmable trigger module 312 coupled to the output of the replica current generator 304. The programmable trigger module 312 is configured or operable to compare a replica current from the replica current generator 304 with one or more programmed current set-points, and provide to over-current protection (OCP) and/or short circuit protection (SCP) signals to firmware in a USB controller (not shown in this figure) including the Vconn switch 300. The firmware generally includes program code to turn off the Vconn switch 300 on detection of an over current event.

In operation, the replica switch (M1_rep) is matched with the first transistor M1 by forcing all nodes or terminals (gate, source and drain) of the replica switch to the same voltages as on nodes of the first transistor M1 using a closed feedback loop in the replica current generator 304, and generates a replica current proportional to the load current flowing through CC lines.

The resistance control module 308 uses the load current information from the replica current generator 304 to control a gate voltage of the second transistor M2, which in turn controls the resistance of the Vconn switch 300. A lower resistance of the Vconn switch 300 is obtained as the gate of the second transistor M2 reaches the output voltage of the charge pump 310 as long as the current flowing through Vconn switch is lower than a programmed maximum current of the programmable trigger module 312, which compares the generated replica current with a programmed maximum current set-point. The resistance control module 308 dynamically controls the gate voltage of the second transistor M2 based on the replica current, which is derived from an actual current flowing through the Vconn switch 300, thereby protecting all circuits and subsystems in or coupled to the USB controller 100 from damage due to over-current, and over or under voltage. In particular, it is noted that a peak or in-rush current to the CC terminal 306 are controlled at startup and during a short circuit event. As the replica current aaccurately matches the current flowing through the Vconn switch 300, this current controlled architecture enables usage of an internally regulated voltage supply to the Vconn terminal 302, such as from a standard 5V supply as specified in the USB-PD specification. Additionally, it is noted that because an operating current through the replica current generator 304 and the resistance control module 308 scales with a load current through the Vconn switch 300 to the CC terminal 306, the Vconn switch exhibits a lower quiescent current at lower load currents.

Figure 4:
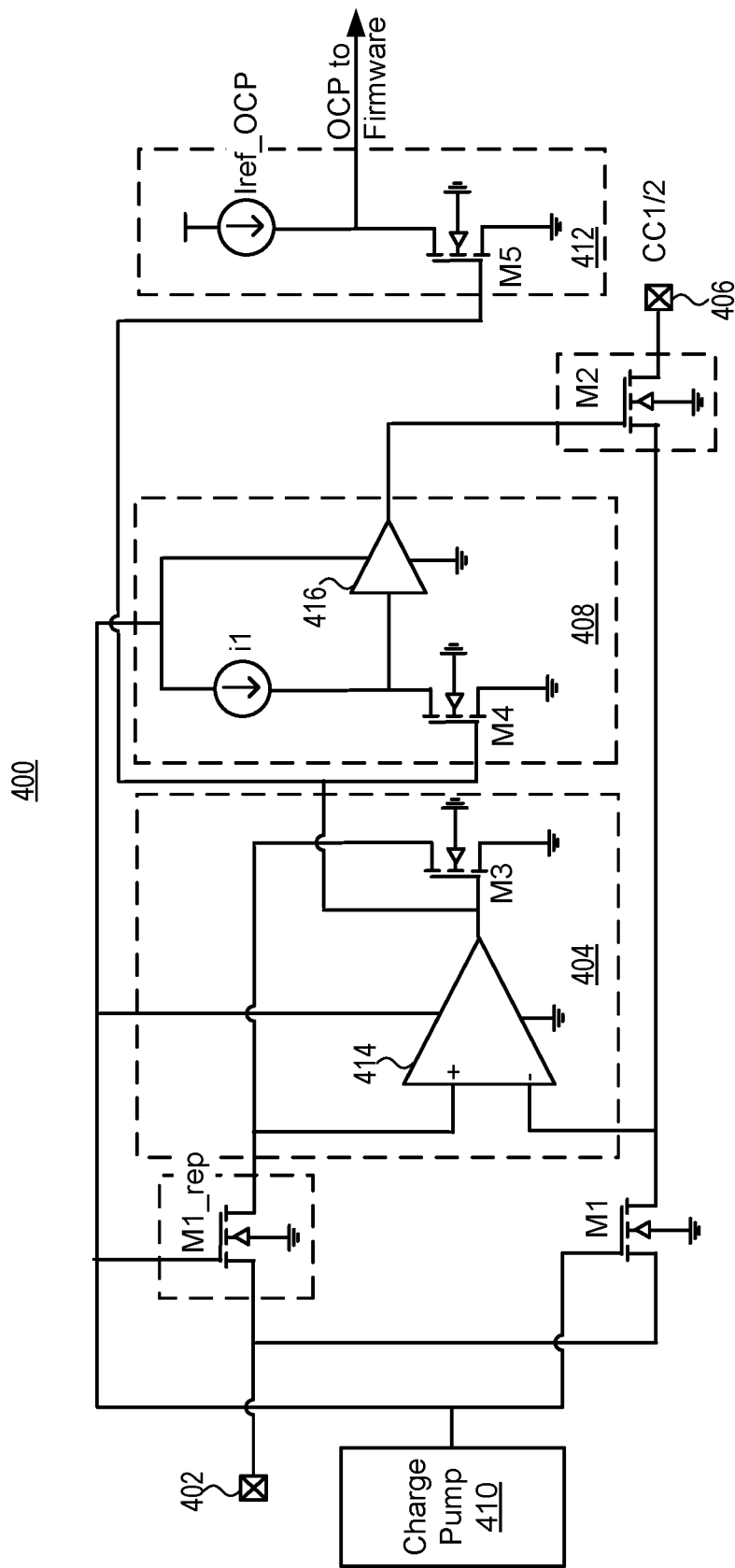
FIG. 4 is a schematic diagram illustrating an embodiment of the Vconn switch architecture of FIG. 3.

FIG. 4 is a schematic diagram illustrating an embodiment of the Vconn switch architecture of FIG. 3. Referring to FIG. 4 the Vconn switch 400 includes a first transistor M1 and a replica switch M1_rep coupled between a Vconn terminal 402 and a replica current generator 404; a second transistor M2 coupled between the first transistor M1 and a CC terminal 406 and controlled by a resistance control module 408; and a charge pump 410; and a programmable trigger module 412. As in the embodiment shown in FIG. 3, the charge pump 410 is coupled in parallel to gate terminals or gates of the first transistor M1 and the replica switch M1_rep.

The replica current generator 404 includes an operational amplifier (OP AMP 414) receiving a voltage from the charge pump 410 and having an inverting input coupled through a first input of the replica current generator to a drain of the first transistor M1, and a non-inverting input coupled through a second input of the replica current generator to a drain of the replica switch M1_rep. The replica current generator 404 further includes a third transistor M3 coupled between the second input and ground and having a gate coupled to an output of the OP AMP 414. The OP AMP 414 and third transistor M3 functions to produce an output current (i.e., replica current) proportional to a difference between the drain voltages of the first transistor M1 and the replica switch M1_rep. As noted above, the replica current generator 404 includes a closed feedback loop from a source of the third transistor M3 to the replica switch M1_rep that forces the current through the replica switch, and therefore voltages on the gate, source and drain of the replica switch M1_rep, to be substantially equal to those on the first transistor M1. The voltage output from the OP AMP 414, which is also an output of the replica current generator 404, is coupled in parallel to the resistance control module 408 and the programmable trigger module 412.

The resistance control module 408 includes a fourth transistor M4 having a gate coupled to the output of the replica current generator 404, a source coupled through a first current supply (ii) to the output of the charge pump 410, and a drain coupled to ground. The resistance control module 408 further includes a buffer 416 receiving a voltage from the charge pump 410 and having an input coupled to the source of the fourth transistor M4 and an output coupled to the gate of the second transistor M2. The resistance control module 408 dynamically controls the voltage to the gate of the second transistor M2 to lower resistance of the Vconn switch 400 as the gate voltage approaches the voltage from the charge pump 410, so long as the current flowing through Vconn switch is lower than a programmed maximum current (ii) determined by a set-point in the programmable trigger module 412 configured via firmware.

The programmable trigger module 412 includes a fifth transistor M5 including a gate coupled to the output of the replica current generator 404, a source coupled to a second or Over Current Protection (OCP) reference current supply (Iref OCP), and a drain coupled to ground. The source of the fifth transistor M5 is further coupled to an output of the programmable trigger module 412, and is configured or operable to compare the replica current with one or more current set-points and to output OCP and/or SCP signals to firmware in the CPU subsystem 102 to cause the CPU subsystem to turn off the Vconn switch 400 on detection of an over current event decoupling the Vconn terminal 402 from the CC terminal 406.

Figure 5:
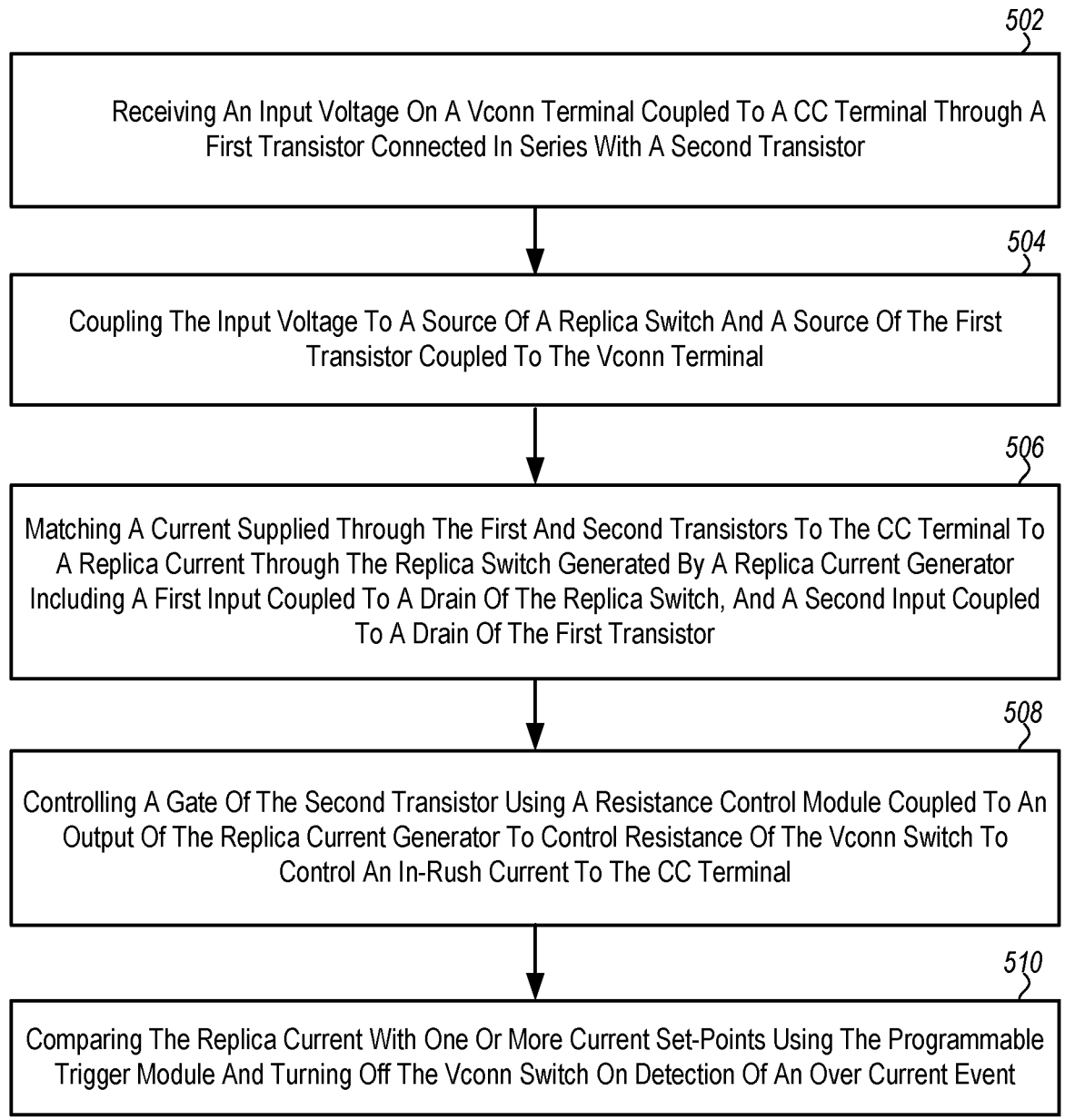
FIG. 5 is a flowchart illustrating a method of operating a Vconn switch having a current-controlled architecture, or a USB controller including such a switch, according to an embodiment of the present disclosure.

A method of operating a Vconn switch having a current-controlled architecture, such as shown in the embodiments of FIGS. 3 and 4, will now be described with reference to the flowchart of FIG. 5. Referring to FIG. 5 the method generally begins with receiving an input voltage on a Vconn terminal coupled to a CC terminal through a first transistor connected in series with a second transistor (step 502). The input voltage is then coupled to a source of a replica switch connected to the Vconn terminal, and to a source of the first transistor (step 504). Next, a current supplied through the first and second transistors to the CC terminal is matched to a replica current through the replica switch generated by a replica current generator (step 506), where the replica current generator has a first input coupled to a drain of the replica switch, and a second input coupled to a drain of the first transistor as described above with reference to FIG. 4. Finally, a gate of the second transistor is controlled using a resistance control module coupled to an output of the replica current generator to control resistance of the Vconn switch, thereby controlling an in-rush current to the CC terminal (step 508). As noted above, controlling the in-rush current is particularly desirable on start-up of a USB controller including the Vconn switch and/or when a short-circuit in a cable coupled to the CC terminal results in a short-circuit or over-current event. Optionally, the Vconn switch further includes a programmable trigger module coupled to the output of the replica current generator, and the method further includes comparing the replica current with one or more current set-points using the programmable trigger module and turning off the Vconn switch on detection of an over current event (510).

Figure 6:
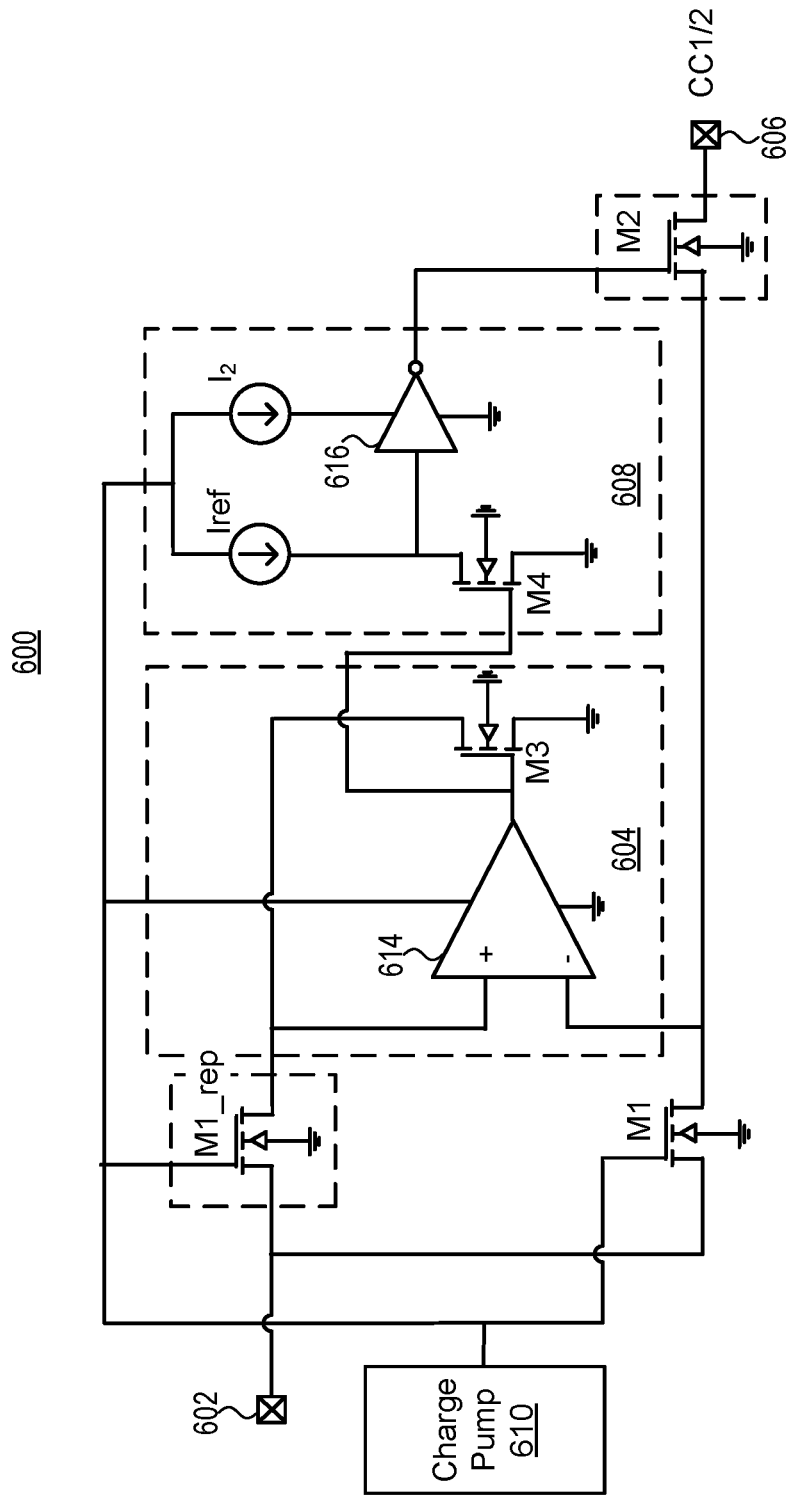
FIG. 6 is a schematic diagram illustrating an alternative embodiment of the Vconn switch architecture using digital control of a second transistor (M2)

Alternative embodiments of a Vconn switch architecture suitable for use in a USB controller will now be described with reference to FIGS. 6 through 9. In particular, FIG. 6 illustrates an alternative embodiment of the Vconn switch architecture 600 using digital control of a second or power transistor (M2). Instead of controlling a gate of the second transistor (M2) in an analog way, the gate of M2 is connected to a current starved inverter 616. The replicated current of the Vconn switch is compared with a reference current (Iref) and a digital output generated. This signal is then used to control the gate of M2 using inverter 616 to provide in-rush current control and short circuit pull down.

Referring to FIG. 6 the Vconn switch 600 includes a first transistor M1 and a replica switch M1_rep coupled between a Vconn terminal 602 and a replica current generator 604; the second transistor M2 coupled between the first transistor M1 and a CC terminal 606 and controlled by a resistance control module 608; and a charge pump 610 coupled in parallel to gate terminals or gates of the first transistor M1 and the replica switch M1_rep. Optionally, the Vconn switch 600 may further include a programmable trigger module 412, as in the embodiment shown in FIG. 4.

The replica current generator 604 includes an operational amplifier (OP AMP 614) receiving a voltage from the charge pump 610 and having an inverting input coupled through a first input of the replica current generator to a drain of the first transistor M1, and a non-inverting input coupled through a second input of the replica current generator to a drain of the replica switch M1_rep. The replica current generator 604 further includes a third transistor M3 coupled between the second input and ground and having a gate coupled to an output of the OP AMP 614. The OP AMP 614 and third transistor M3 functions to produce an output current (i.e., replica current) proportional to a difference between the drain voltages of the first transistor M1 and the replica switch M1_rep. As noted above, the replica current generator 604 includes a closed feedback loop from a source of the third transistor M3 to the replica switch M1_rep that forces the current through the replica switch, and therefore voltages on the gate, source and drain of the replica switch M1_rep, to be substantially equal to those on the first transistor M1. The voltage output from the OP AMP 614, which is also an output of the replica current generator 604, is coupled to the resistance control module 608.

The resistance control module 608 includes a fourth transistor M4 having a gate coupled to the output of the replica current generator 604, a source coupled to a reference current supply (Iref), and a drain coupled to ground. The resistance control module 608 further includes the inverter 616 receiving a current from a second current supply ($I_2$) and having an input coupled to the source of the fourth transistor M4 and an output coupled to the gate of the second transistor M2. The resistance control module 608 dynamically controls the voltage to the gate of the second transistor M2 to lower resistance of the Vconn switch 600 as the gate voltage approaches the voltage from the charge pump 610.

Figure 7:
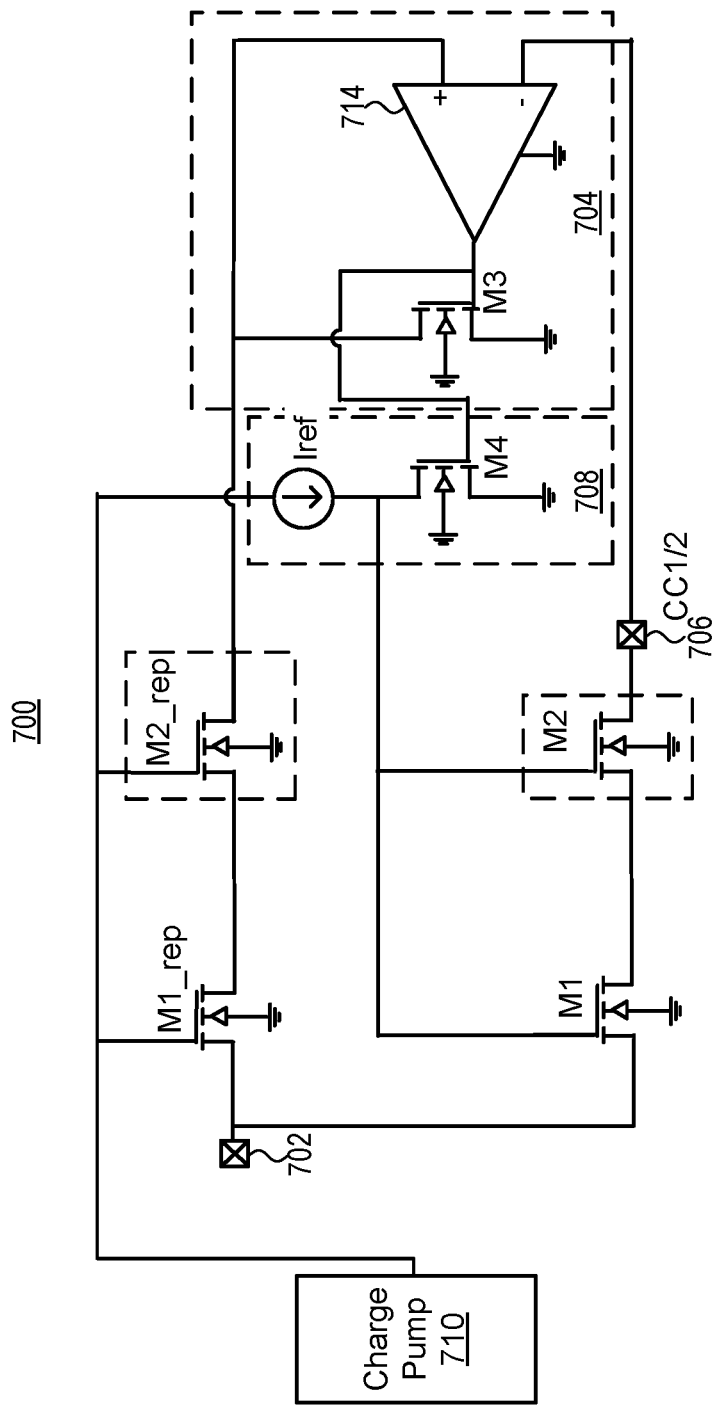
FIG. 7 is a schematic diagram illustrating an alternative embodiment of the Vconn switch architecture including replicas of both first and second transistors (M1rep and M2rep), to generate a replica of load current and comparing this current to that through a CC terminal to control the second transistor.

FIG. 7 is a schematic diagram illustrating an alternative embodiment of the Vconn switch architecture 700 including replicas of both first and second transistors (M1_rep and M2_rep) to generate a replica of load current, and an operational amplifier (OP AMP 714) coupled to compare this current to that through a CC terminal to control first and second power transistors (M1 and M2) to provide in-rush current control and short circuit pull down. Referring to FIG. 7 the Vconn switch 700 includes a first replica switch (M1_rep) and a second replica switch (M2_rep) coupled in series between a Vconn terminal 702 and a replica current generator 704; the first transistor M1 and second transistor M2 coupled in series between a Vconn terminal 702 and a CC terminal 706 and controlled by a resistance control module 708; and a charge pump 710 coupled in parallel to gate terminals or gates of M1_rep and M2_rep.

The OP AMP 714 receives on a non-inverting input a replica of load current from the first and second replica switches (M1_rep and M2_rep), and has an inverting input coupled through the CC terminal 706 to a source of the second transistor M2. The replica current generator 704 further includes a third transistor M3 coupled between the non-inverting input and ground and having a gate coupled to an output of the OP AMP 714. The OP AMP 714 includes a closed feedback loop from a source of the third transistor M3 to the non-inverting input. The voltage output from the OP AMP 714 is coupled to the resistance control module 708.

The resistance control module 708 includes a fourth transistor M4 having a gate coupled to the output of the replica current generator 704, a source coupled to a reference current supply (Iref), and a drain coupled to ground. The source of fourth transistor M4 is coupled in parallel to gates of the first and second transistors (M1 and M2) to lower the resistance of the Vconn switch 700 as the gate voltage approaches the voltage from the charge pump 710.

Figure 8:
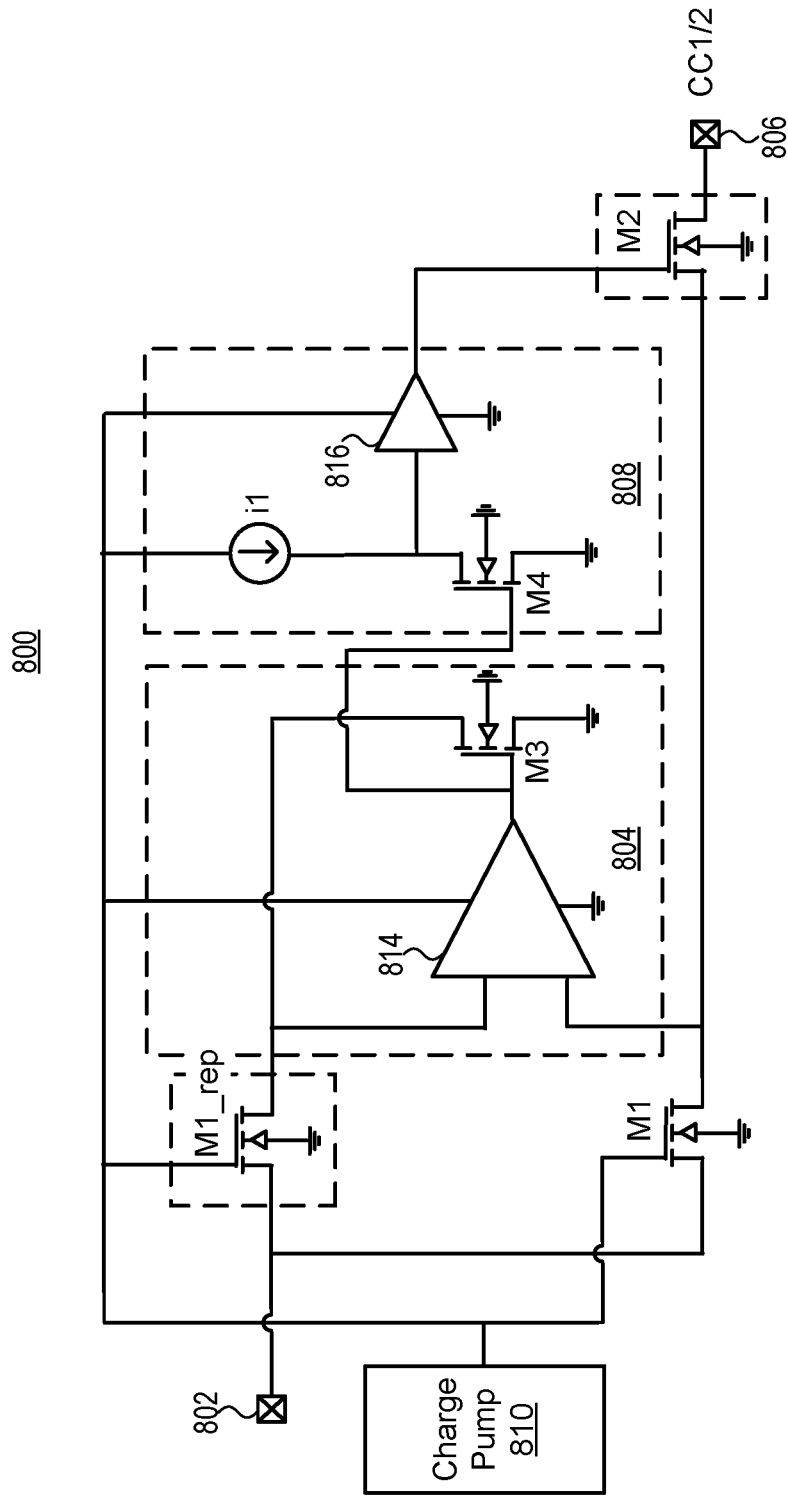
FIG. 8 is a schematic diagram illustrating an alternative embodiment of the Vconn switch architecture in which any type of analog buffer is used to control an output transistor (M2)

FIG. 8 is a schematic diagram illustrating an alternative embodiment of the Vconn switch architecture in which any type of analog buffer may be used to pull up a gate of a second power transistor (M2) to control resistance of the Vconn switch to control inrush current and short circuit pull down. Referring to FIG. 8 the Vconn switch 800 includes a first transistor M1 and a replica switch M1_rep coupled between a Vconn terminal 802 and a replica current generator 804; a second transistor M2 coupled between the first transistor M1 and a CC terminal 806 and controlled by a resistance control module 808; and a charge pump 810.

The replica current generator 804 includes an operational amplifier (OP AMP 814) receiving a voltage from the charge pump 810 and having an inverting input coupled through a first input of the replica current generator to a drain of the first transistor M1, and a non-inverting input coupled through a second input of the replica current generator to a drain of the replica switch M1_rep. The replica current generator 804 further includes a third transistor M3 coupled between the second input and ground and having a gate coupled to an output of the OP AMP 814. The OP AMP 814 and third transistor M3 functions to produce an output current (i.e., replica current) proportional to a difference between the drain voltages of the first transistor M1 and the replica switch M1_rep. As noted above, the replica current generator 804 includes a closed feedback loop from a source of the third transistor M3 to the replica switch M1_rep that forces the current through the replica switch, and therefore voltages on the gate, source and drain of the replica switch M1_rep, to be substantially equal to those on the first transistor M1. The voltage output from the OP AMP 814, which is also an output of the replica current generator 804, is coupled to the resistance control module 808.

The resistance control module 808 includes a fourth transistor M4 having a gate coupled to the output of the replica current generator 804, a source coupled through a first current supply (i1) to the output of the charge pump 810, and a drain coupled to ground. As described above, the buffer 816 receives a voltage from the charge pump 810 and has an input coupled to the source of the fourth transistor M4 and an output coupled to the gate of the second transistor M2. The resistance control module 808 dynamically controls the voltage to the gate of the second transistor M2 to lower resistance of the Vconn switch 800 as the gate voltage approaches the voltage from the charge pump 810.

Figure 9:
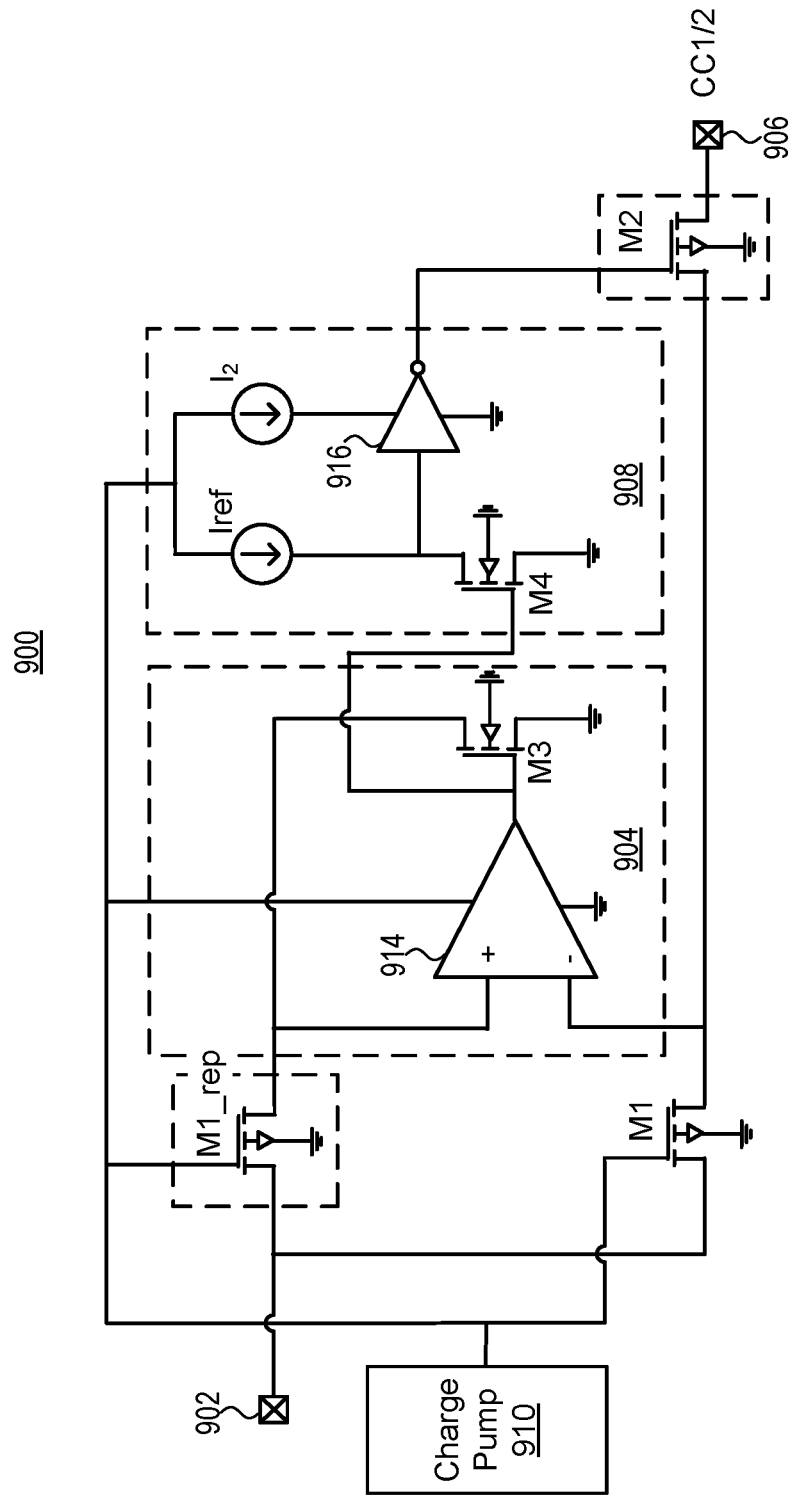
FIG. 9 is a schematic diagram illustrating an alternative embodiment of the Vconn switch architecture similar to that of FIG. 8, but in which NMOS transistors (M1, M1_rep and M2) have been replaced by PMOS transistors.

FIG. 9 is a schematic diagram illustrating an alternative embodiment of a Vconn switch 900 similar to that of FIG. 8, but in which NMOS transistors (M1, M1_rep and M2) have been replaced by PMOS transistors. Generally, the operation and performance of the Vconn switch 900 is the same as that of FIG. 8 using NMOS switches. Referring to FIG. 8 the Vconn switch 900 includes a first transistor M1 and a replica switch M1_rep coupled between a Vconn terminal 902 and a replica current generator 904; a second transistor M2 coupled between the first transistor M1 and a CC terminal 906 and controlled by a resistance control module 908; and a charge pump 910.

The replica current generator 904 includes an operational amplifier (OP AMP 914) receiving a voltage from the charge pump 910 and having an inverting input coupled through a first input of the replica current generator to a drain of the first transistor M1, and a non-inverting input coupled through a second input of the replica current generator to a drain of the replica switch M1_rep. The replica current generator 904 further includes a third transistor M3 coupled between the second input and ground and having a gate coupled to an output of the OP AMP 914. The OP AMP 914 and third transistor M3 functions to produce an output current (i.e., replica current) proportional to a difference between the drain voltages of the first transistor M1 and the replica switch M1_rep. As noted above, the replica current generator 904 includes a closed feedback loop from a source of the third transistor M3 to the replica switch M1_rep that forces the current through the replica switch, and therefore voltages on the gate, source and drain of the replica switch M1_rep, to be substantially equal to those on the first transistor M1. The voltage output from the OP AMP 914, which is also an output of the replica current generator 904, is coupled to the resistance control module 908.

The resistance control module 908 includes a fourth transistor M4 having a gate coupled to the output of the replica current generator 904, a source coupled to a reference current supply (Iref), and a drain coupled to ground. The resistance control module 908 further includes the inverter 916 receiving a current from a second current supply ($I_2$) and having an input coupled to the source of the fourth transistor M4 and an output coupled to the gate of the second transistor M2. The resistance control module 908 dynamically controls the voltage to the gate of the second transistor M2 to lower resistance of the Vconn switch 900 as the gate voltage approaches the voltage from the charge pump 910.

Thus, an on-chip, IC USB type-C controller including a Vconn switch having an architecture for providing OCP, SCP, including at startup, inrush current control, and a low quiescent current with the OCP and SCP in no load scenarios, have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description.

23 Docket No. : CD20064

Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A Vconn switch comprising:
a first transistor and second transistor coupled in series between a Vconn terminal and a communication channel (CC) terminal, the first transistor including a source coupled to the Vconn terminal;
a replica switch including a source coupled to the Vconn terminal;
a replica current generator including a first input coupled to a drain of the first transistor and a second input coupled to a drain of the replica switch; and
a resistance control module coupled to an output of the replica current generator and including a buffer and an output coupled to a gate of the second transistor,
wherein the replica current generator is operable to match a replica current through the replica switch to that of a current supplied through the first and second transistors to the CC terminal and the resistance control module is operable to control resistance of the Vconn switch to control an in-rush current to the CC terminal,
wherein the replica current generator comprises a third transistor coupled between the second input and ground, and an operational amplifier including an inverting input coupled to the first input, a non-inverting input coupled to the second input, and an output coupled in parallel to the output of the of the replica current generator and to a gate of the third transistor, and wherein the first transistor, second transistor and replica switch are NMOS transistors.

2. The Vconn switch of claim 1 further comprising a charge pump, wherein a gate of the first transistor and a gate of the replica switch are coupled in parallel to an output of the charge pump.

3. The Vconn switch of claim 2 wherein the third transistor is a NMOS transistor.

4. The Vconn switch of claim 3 wherein the operational amplifier is coupled to and powered by the output of the charge pump.

5. The Vconn switch of claim 3 wherein the resistance control module comprises a fourth transistor including a gate coupled to the output of the replica current generator, a source coupled through a first current supply to the output of the charge pump, and a drain coupled to ground, the source of the fourth transistor further coupled through the buffer to the gate of the second transistor, and wherein the fourth transistor is a NMOS transistor.

6. The Vconn switch of claim 5 wherein the buffer is coupled to and powered by the charge pump.

7. A Vconn switch comprising:
a first transistor and second transistor coupled in series between a Vconn terminal and a communication channel (CC) terminal, the first transistor including a source coupled to the Vconn terminal;
a replica switch including a source coupled to the Vconn terminal;
a replica current generator including a first input coupled to a drain of the first transistor and a second input coupled to a drain of the replica switch;
a resistance control module coupled to an output of the replica current generator and including a buffer and an output coupled to a gate of the second transistor; and
a programmable trigger module coupled to the output of the replica current generator,
wherein the replica current generator is operable to match a replica current through the replica switch to that of a current supplied through the first and second transistors to the CC terminal and the resistance control module is operable to control resistance of the Vconn switch to control an in-rush current to the CC terminal, the programmable trigger module is operable to compare replica current with one or more current set-points and turn off the Vconn switch on detection of an over current event, and the first transistor, second transistor and replica switch are NMOS transistors.

8. The Vconn switch of claim 7 wherein the programmable trigger module comprises a transistor including a gate coupled to the output of the replica current generator, a source coupled to a second current supply, and a drain coupled to ground, the source of the transistor further coupled to an output of the programmable trigger module to output Over Current Protection (OCP) and/or short circuit protection (SCP) signals.

9. A Universal Serial Bus (USB) controller comprising:
a USB power delivery (USB-PD) subsystem comprising a Vconn switch,
wherein the Vconn switch comprises:
   a first transistor and second transistor coupled in series between a Vconn terminal and a communication channel (CC) terminal, the first transistor including a source coupled to the Vconn terminal;
   a replica switch including a source coupled to the Vconn terminal;
   a replica current generator including a first input coupled to a drain of the first transistor and a second input coupled to a drain of the replica switch, the replica current generator operable to match a replica current through the replica switch to that of a current supplied through the first and second transistors to the CC terminal; and
a resistance control module coupled to an output of the replica current generator and including a buffer and an output coupled to a gate of the second transistor, the resistance control module operable to control resistance of the Vconn switch to control an in-rush current to the CC terminal,
wherein the replica current generator comprises a third transistor coupled between the second input and ground, and an operational amplifier including an inverting input coupled to the first input, a non-inverting input coupled to the second input, and an output coupled in parallel to the output of the of the replica current generator and to a gate of the third transistor, and wherein the first transistor, second transistor and replica switch are NMOS transistors.

10. The USB controller of claim 9 further comprising a charge pump, wherein a gate of the first transistor and a gate of the replica switch are coupled in parallel to an output of the charge pump.

11. The USB controller of claim 10 wherein the third transistor is a NMOS transistor.

12. The USB controller of claim 11 wherein the resistance control module comprises a fourth transistor including a gate coupled to the output of the replica current generator, a source coupled through a first current supply to the output of the charge pump, and a drain coupled to ground, the source of the fourth transistor further coupled through the buffer to the gate of the second transistor, and wherein the fourth transistor is a NMOS transistor.

13. The USB controller of claim 11 further comprising a programmable trigger module coupled to the output of the replica current generator, the programmable trigger module operable to compare replica current with one or more current set-points and turn off the Vconn switch on detection of an over current event.

14. The USB controller of claim 13 wherein the programmable trigger module comprises a fifth transistor including a gate coupled to the output of the replica current generator, a source coupled to a second current supply, and a drain coupled to ground, the source of the fifth transistor further coupled to an output of the programmable trigger module to output Over Current Protection (OCP) and/or short circuit protection (SCP) signals.

15. The USB controller of claim 9 further including a power-rail through which the first transistor and the second transistor are coupled to the CC terminal, and wherein the power-rail is coupled to a VDDD supply to power the USB controller.

16. The USB controller of claim 9 wherein the USB controller is a Universal Serial Bus Type-C(USB-C) controller.

17. A method of operating a Vconn switch comprising:
receiving an input voltage on a Vconn terminal coupled to a communication channel (CC) terminal through a first transistor connected in series with a second transistor;
coupling the input voltage to a source of a replica switch coupled to the Vconn terminal;
matching a current supplied through the first and second transistors to the CC terminal to a replica current through the replica switch generated by a replica current generator including a first input coupled to a drain of the first transistor, and a second input coupled to a drain of the replica switch; and
controlling a gate of the second transistor using a resistance control module coupled to an output of the replica current generator to control resistance of the Vconn switch, the resistance control module including a buffer and an output through which it is coupled to the gate of the second transistor,
wherein the replica current generator comprises a third transistor coupled between the second input and ground, and an operational amplifier including an inverting input coupled to the first input, a non-inverting input coupled to the second input, and an output coupled in parallel to the output of the of the replica current generator and to a gate of the third transistor, and wherein matching a current supplied through the first and second transistors to the CC terminal to a replica current through the replica switch comprises coupling a gate of the first transistor and a gate of the replica switch to an output of a charge pump, and wherein the first transistor, second transistor, third transistor and replica switch are NMOS transistors.

18. The method of claim 17 wherein the resistance control module comprises a fourth transistor including a gate coupled to the output of the replica current generator, a source coupled through a first current supply to the output of the charge pump, and a drain coupled to ground, the source of the fourth transistor further coupled through the buffer to the gate of the second transistor, and wherein controlling resistance of the Vconn switch comprises controlling the gate of the second transistor to control an in-rush current through the second transistor, and wherein the fourth transistor is a NMOS transistor.

19. The method of claim 17 wherein the Vconn switch further comprises a programmable trigger module coupled to the output of the replica current generator, and further comprising comparing the replica current with one or more current set-points using the programmable trigger module and turning off the Vconn switch on detection of an over current event.

* * * * *